(12) United States Patent
Bunyk et al.

(10) Patent No.: US 8,247,799 B2
(45) Date of Patent: *Aug. 21, 2012

(54) SUPERCONDUCTING SHIELDING FOR USE WITH AN INTEGRATED CIRCUIT FOR QUANTUM COMPUTING

(75) Inventors: Paul I. Bunyk, Vancouver (CA); Mark W. Johnson, Vancouver (CA); Jeremy P. Hilton, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 74 days.

This patent is subject to a terminal disclaimer.

(21) Appl. No.: 12/703,534

(22) Filed: Feb. 10, 2010

(65) Prior Publication Data

US 2010/0133514 A1 Jun. 3, 2010

Related U.S. Application Data

(63) Continuation of application No. 11/948,817, filed on Nov. 30, 2007.

(60) Provisional application No. 60/868,312, filed on Dec. 1, 2006.

(51) Int. Cl.
*H01L 39/00* (2006.01)

(52) U.S. Cl. .......... 257/31; 257/E39.003; 505/170; 505/872; 307/91

(58) Field of Classification Search .......... 505/170, 505/872; 257/E39.003, 660, 30, 31; 307/91
See application file for complete search history.

(56) References Cited

U.S. PATENT DOCUMENTS

| 5,173,660 | A | 12/1992 | Marsden ............... 324/248 |
|---|---|---|---|
| 5,280,241 | A | 1/1994 | Ueda et al. ........... 324/248 |
| 6,518,673 | B2 | 2/2003 | Herr et al. ............ 257/758 |
| 6,838,694 | B2 | 1/2005 | Esteve et al. ......... 257/34 |
| 6,984,846 | B2 | 1/2006 | Newns et al. ......... 257/31 |
| 7,687,938 | B2 * | 3/2010 | Bunyk et al. ......... 307/91 |
| 2003/0038286 | A1 | 2/2003 | Van Duzer et al. ... 257/31 |
| 2003/0183935 | A1 | 10/2003 | Herr et al. ............ 257/758 |
| 2003/0193097 | A1 * | 10/2003 | Il'ichev et al. ....... 257/E27.007 |
| 2005/0082519 | A1 | 4/2005 | Amin et al. ........... 257/13 |

FOREIGN PATENT DOCUMENTS

| JP | 63124585 | 5/1988 |
|---|---|---|
| JP | 63209185 | 8/1988 |
| WO | 96/09654 | 3/1996 |
| WO | 99/14800 | 3/1999 |

OTHER PUBLICATIONS

Farhi et al., "Quantum Adiabatic Evolution Algorithms versus Simulated Annealing," *arXiv.org*, URL=http://arxiv:quant-ph/0201031, pp. 1-16, Jan. 8, 2002.

Feynman, "Simulating Physics with Computers," *International Journal of Theoretical Physics* 21(6/7):467-488, 1982.

Harris, R.G., "Systems, Devices, and Methods for Controllably Coupling Qubits," U.S. Appl. No. 60/886,253, filed Jan. 23, 2007.

(Continued)

*Primary Examiner* — Thao Le
*Assistant Examiner* — Allen Parker
(74) *Attorney, Agent, or Firm* — Seed IP Law Group PLLC

(57) ABSTRACT

An integrated circuit for quantum computing may include a superconducting shield to limit magnetic field interactions.

20 Claims, 7 Drawing Sheets

OTHER PUBLICATIONS

Harris, R.G., "Systems, Devices, and Methods for Controllably Coupling Qubits," U.S. Appl. No. 12/017,995, filed Jan. 22, 2008.

Lanting et al., "Geometrical Dependence of the Low-Frequency Noise in Superconducting Flux Qubits," *Physical Review B* 79(060509 R):1-4, 2009.

Makhlin et al., "Quantum-state Engineering with Josephson-junction Devices," *Reviews of Modern Physics* 73:357-400, Apr. 2001.

Nagasawa et al., "Development of Advanced Nb Process for SFQ Circuits," *Physica C* 412-414:1429-1436, 2004.

Nielsen and Chuang, *Quantum Computation and Quantum Information*, Cambridge University Press, Cambridge, 2000, Chapter 7.8, "Other Implementation Schemes," pp. 343-345.

Satoh et al., "Fabrication Process of Planarized Multi-Layer Nb Integrated Circuits," *IEEE Transactions on Applied Superconductivity* 15(2):78-81, Jun. 2005.

Satoh et al., "Planarization of Josephson Junctions for Large-scale Integrated Nb SFQ Circuits by Mechanical Polishing," *Physica C* 412-414:1447-1450, 2004.

Shor, "Introduction to Quantum Algorithms," *arXiv.org*, URL=http://arxiv:quant-ph/00005003, pp. 1-17, Jul. 6, 2001.

International Search Report for PCT/CA2007/002174, mailed Mar. 17, 2008, 4 pages.

Office Action mailed Jul. 2, 2009 in U.S. Appl. No. 11/948,817, 26 pages.

Applicants' Amendment mailed Oct. 2, 2009 in U.S. Appl. No. 11/948,817, 19 pages.

Notice of Allowance and Examiner's Amendment mailed Dec. 22, 2009 in U.S. Appl. No. 11/948,817, 12 pages.

\* cited by examiner

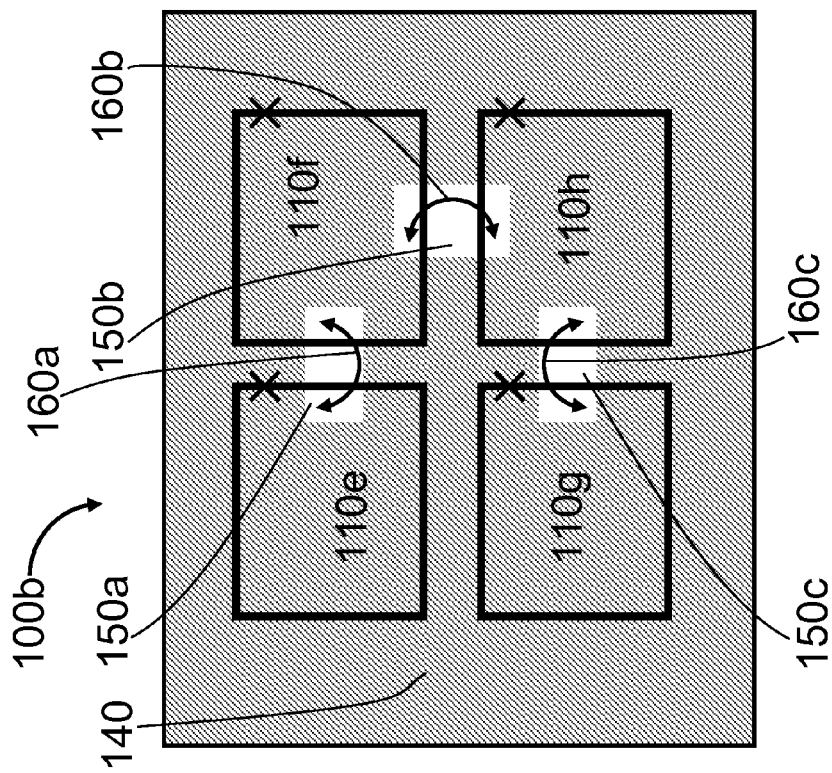
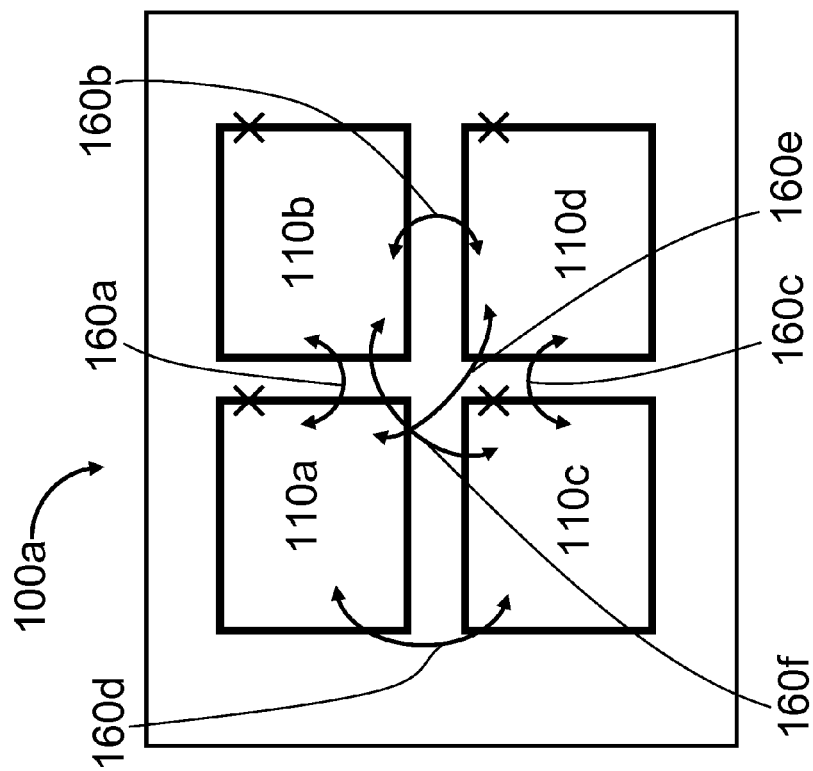

SUPERCONDUCTING SHIELDING FOR USE WITH AN INTEGRATED CIRCUIT FOR QUANTUM COMPUTING

CROSS-REFERENCES TO RELATED APPLICATIONS

This application is a continuation of U.S. patent application Ser. No. 11/948,817, filed Nov. 30, 2007, which claims benefit under 35 U.S.C. §119(e) from U.S. Provisional Patent Application Ser. No. 60/868,312, filed Dec. 1, 2006, each of which are incorporated herein by reference in their entirety.

BACKGROUND

1. Field

The present systems, methods and apparatus relate to superconducting shielding techniques for use with integrated circuits for quantum computing.

2. Description of the Related Art

A Turing machine is a theoretical computing system, described in 1936 by Alan Turing. A Turing machine that can efficiently simulate any other Turing machine is called a Universal Turing Machine (UTM). The Church-Turing thesis states that any practical computing model has either the equivalent or a subset of the capabilities of a UTM.

An analog processor is a processor that employs fundamental properties of a physical system to find the solution to a computation problem. In contrast to a digital processor, which requires an algorithm for finding the solution followed by the execution of each step in the algorithm according to Boolean methods, analog processors do not involve Boolean methods.

A quantum computer is any physical system that harnesses one or more quantum effects to perform a computation. A quantum computer that can efficiently simulate any other quantum computer is called a Universal Quantum Computer (UQC).

In 1981 Richard P. Feynman proposed that quantum computers could be used to solve certain computational problems more efficiently than a UTM and therefore invalidate the Church-Turing thesis. See e.g., Feynman R. P., "Simulating Physics with Computers", International Journal of Theoretical Physics, Vol. 21 (1982) pp. 467-488. For example, Feynman noted that a quantum computer could be used to simulate certain other quantum systems, allowing exponentially faster calculation of certain properties of the simulated quantum system than is possible using a UTM.

Approaches to Quantum Computation

There are several general approaches to the design and operation of quantum computers. One such approach is the "circuit model" of quantum computation. In this approach, qubits are acted upon by sequences of logical gates that are the compiled representation of an algorithm. Circuit model quantum computers have several serious barriers to practical implementation. In the circuit model, it is required that qubits remain coherent over time periods much longer than the single-gate time. This requirement arises because circuit model quantum computers require operations that are collectively called quantum error correction in order to operate. Quantum error correction cannot be performed without the circuit model quantum computer's qubits being capable of maintaining quantum coherence over time periods on the order of 1,000 times the single-gate time. Much research has been focused on developing qubits with coherence sufficient to form the basic information units of circuit model quantum computers. See e.g., Shor, P. W. "Introduction to Quantum Algorithms", arXiv.org:quant-ph/0005003 (2001), pp. 1-27. The art is still hampered by an inability to increase the coherence of qubits to acceptable levels for designing and operating practical circuit model quantum computers.

Another approach to quantum computation, involves using the natural physical evolution of a system of coupled quantum systems as a computational system. This approach does not make critical use of quantum gates and circuits. Instead, starting from a known initial Hamiltonian, it relies upon the guided physical evolution of a system of coupled quantum systems wherein the problem to be solved has been encoded in the terms of the system's Hamiltonian, so that the final state of the system of coupled quantum systems contains information relating to the answer to the problem to be solved. This approach does not require long qubit coherence times. Examples of this type of approach include adiabatic quantum computation, cluster-state quantum computation, one-way quantum computation, quantum annealing and classical annealing, and are described, for example, in Farhi, E. et al., "Quantum Adiabatic Evolution Algorithms versus Stimulated Annealing" arXiv.org:quant-ph/0201031 (2002), pp 1-24.

Qubits

As mentioned previously, qubits can be used as fundamental units of information for a quantum computer. As with bits in UTMs, qubits can refer to at least two distinct quantities; a qubit can refer to the actual physical device in which information is stored, and it can also refer to the unit of information itself, abstracted away from its physical device.

Qubits generalize the concept of a classical digital bit. A classical information storage device can encode two discrete states, typically labeled "0" and "1". Physically these two discrete states are represented by two different and distinguishable physical states of the classical information storage device, such as direction or magnitude of magnetic field, current, or voltage, where the quantity encoding the bit state behaves according to the laws of classical physics. A qubit also contains two discrete physical states, which can also be labeled "0" and "1". Physically these two discrete states are represented by two different and distinguishable physical states of the quantum information storage device, such as direction or magnitude of magnetic field, current, or voltage, where the quantity encoding the bit state behaves according to the laws of quantum physics. If the physical quantity that stores these states behaves quantum mechanically, the device can additionally be placed in a superposition of 0 and 1. That is, the qubit can exist in both a "0" and "1" state at the same time, and so can perform a computation on both states simultaneously. In general, N qubits can be in a superposition of $2^N$ states. Quantum algorithms make use of the superposition property to speed up some computations.

In standard notation, the basis states of a qubit are referred to as the $|0\rangle$ and $|1\rangle$ states. During quantum computation, the state of a qubit, in general, is a superposition of basis states so that the qubit has a nonzero probability of occupying the $|0\rangle$ basis state and a simultaneous nonzero probability of occupying the $|1\rangle$ basis state. Mathematically, a superposition of basis states means that the overall state of the qubit, which is denoted $|\Psi\rangle$, has the form $|\Psi\rangle = a|0\rangle + b|1\rangle$, where a and b are coefficients corresponding to the probabilities $|a|^2$ and $|b|^2$, respectively. The coefficients a and b each have real and imaginary components, which allows the phase of the qubit to be characterized. The quantum nature of a qubit is largely derived from its ability to exist in a coherent superposition of basis states and for the state of the qubit to have a phase. A qubit will retain this ability to exist as a coherent superposition of basis states when the qubit is sufficiently isolated from sources of decoherence.

To complete a computation using a qubit, the state of the qubit is measured (i.e., read out). Typically, when a measurement of the qubit is performed, the quantum nature of the qubit is temporarily lost and the superposition of basis states collapses to either the $|0\rangle$ basis state or the $|1\rangle$ basis state and thus regaining its similarity to a conventional bit. The actual state of the qubit after it has collapsed depends on the probabilities $|a|^2$ and $|b|^2$ immediately prior to the readout operation.

Superconducting Qubits

There are many different hardware and software approaches under consideration for use in quantum computers. One hardware approach uses integrated circuits formed of superconducting materials, such as aluminum or niobium. The technologies and processes involved in designing and fabricating superconducting integrated circuits are in some respects similar to those used for conventional integrated circuits.

Superconducting qubits are a type of superconducting device that can be included in a superconducting integrated circuit. Superconducting qubits can be separated into several categories depending on the physical property used to encode information. For example, they may be separated into charge, flux and phase devices, as discussed in, for example Makhlin et al., 2001, *Reviews of Modern Physics* 73, pp. 357-400. Charge devices store and manipulate information in the charge states of the device, where elementary charges consist of pairs of electrons called Cooper pairs. A Cooper pair has a charge of 2e and consists of two electrons bound together by, for example, a phonon interaction. See e.g., Nielsen and Chuang, *Quantum Computation and Quantum Information*, Cambridge University Press, Cambridge (2000), pp. 343-345. Flux devices store information in a variable related to the magnetic flux through some part of the device. Phase devices store information in a variable related to the difference in superconducting phase between two regions of the phase device. Recently, hybrid devices using two or more of charge, flux and phase degrees of freedom have been developed. See e.g., U.S. Pat. No. 6,838,694 and U.S. Patent Application No. 2005-0082519.

A qubit comprising a superconducting main loop serially-interconnected to a subloop which contains two Josephson junctions is said to employ a gradiometer-based flux qubit. An example of this approach is discussed in U.S. Pat. No. 6,984,846.

Quantum Processor

A computer processor may take the form of an analog processor, for instance a quantum processor such as a superconducting quantum processor. A superconducting quantum processor may include a number of qubits and associated local bias devices, for instance two or more superconducting qubits.

A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in U.S. patent application Ser. No. 11/247,857 and U.S. Provisional Patent Application No. 60/886,253. Respective coupling strengths of the coupling devices may be tuned between zero and a maximum value, for example, to provide ferromagnetic or anti-ferromagnetic coupling between qubits.

Regardless of the specific hardware being implemented, managing a single qubit requires control over a number of parameters. Conventionally, this requirement necessitated outside communication (that is, communication from outside of the processor architecture) with individual qubits. However, since overall processing power increases with the number of qubits in the system, high capacity processors that exceed the abilities of conventional supercomputers must manage a large number of qubits and thus the conventional approach of employing outside control over multiple parameters on individual qubits requires a complicated system for programming qubit parameters.

Thus, the scalability of quantum processors is limited by the complexity of the qubit parameter control system and there remains a need in the art for a scalable qubit parameter control system.

Shielding and Noise

Magnetic fields produced by external sources may cause unwanted interactions with devices in the integrated circuit. Accordingly, there may be a need for a superconducting shield proximate to devices populating the integrated circuit to reduce the strength of interference such as magnetic and electrical fields. An example of this is discussed in WO 96/09654.

Superconducting shielding incorporated into an integrated circuit has been used to protect superconducting quantum interference device (SQUID) packages from DC and AC noise, such as magnetic and electrical fields, that would otherwise interfere with operation of the integrated circuit. Regions of the integrated circuit can be unshielded to allow for communication between magnetic and electrical fields external to the SQUID package. An example of this approach is discussed in U.S. Pat. No. 5,173,660.

Superconducting shielding layers may be used in single flux quantum (SFQ) or rapid single flux quantum (RSFQ) technology to separate devices from DC power lines that could otherwise undesirably bias the devices. The devices populate the integrated circuit but are separated from the DC power lines by placing a ground plane between the devices and the DC power line. Examples of this type of approach are described, for example, in Nagasawa et al., "Development of advanced Nb process for SFQ circuits" Physica C 412-414 (2004) 1429-1436 (herein referred to as Nagasawa) and Satoh et al., "Fabrication Process of Planarized Multi-Layer Nb Integrated Ciruits" IEEE Transactions on Applied Superconductivity, Vol. 15, No. 2, (June 2005).

In SFQ circuits, ground planes and shielding layers are terminologies used interchangeably. A ground plane in SFQ integrated circuit is a layer of metal that appears to most signals within the circuit as an infinite ground potential. The ground plane helps to reduce noise within the integrated circuit but may be used to ensure that all components within the SFQ integrated circuits have a common potential to compare voltage signals. Nagasawa shows the use of contacts between wiring layers and a ground plane throughout SFQ circuitry.

Supercurrent flowing in superconducting wires has an associated magnetic field in the same manner as electrons flowing in normal metal wires. Magnetic fields can couple inductively to superconducting wires, inducing currents to flow. Quantum information processing with superconducting integrated circuits necessarily involves supercurrents moving in wires, and hence associated magnetic fields.

The quantum properties of quantum devices are very sensitive to noise, and stray magnetic fields in superconducting quantum devices can negatively impact the quantum information processing properties of such circuits. Superconducting ground planes have been used in the art to reduce cross-talk between control lines and devices. However, such approaches have only been used in superconducting integrated circuits for classical processing and sensor applications, which are relatively robust against in-circuit noise and operate at significantly higher temperatures as compared with superconducting quantum processing integrated circuits.

In superconducting quantum processing integrated circuits, it is desirable to substantially attenuate and control unwanted cross-talk between devices, otherwise quantum information processing at commercial scales may not be possible. The present methods, systems and apparatus provide techniques for attenuating cross-talk in superconducting quantum processing integrated circuits between quantum devices in order to support the desired quantum effects and controllably couple quantum devices in a manner that permits exchange of coherent quantum information.

BRIEF SUMMARY

At least one embodiment may be summarized as an integrated circuit for quantum computing including a first metal layer; superconducting shield in a shielded region of the integrated circuit so as to limit magnetic field interactions in the shielded region between at least two devices located in the shielded region when the integrated circuit is operated at a temperature suitable for quantum computing; and a first dielectric layer between at least a portion of the first metal layer and at least a portion of the second metal layer.

At least two devices located in the shielded region may not use the superconducting shield as a ground plane. The magnetic field interactions may be produced by a current flowing through at least a portion of at least one of the first metal layer or the second metal layer. The at least two devices may be selected from the group consisting of Josephson junctions, qubits, qubit readouts and qubit-qubit couplers. The at least two devices may be selected from the group consisting of wiring and conductive traces. The integrated circuit may include at least one additional dielectric layer and at least one additional metal layer. The first metal layer and the second metal layer may each be composed of a superconducting material. The superconducting material may be selected from the group consisting of aluminium and niobium. The superconducting shield may localize the magnetic field interactions produced by at least one of the devices in the shielded region. The at least two devices may be proximate to one another and may be magnetically isolated from each other. A device parameter of a first device may be manipulated without affecting a state of a second device. The integrated circuit may include an unshielded region, wherein magnetic field interactions produced by at least one device located in the unshielded region may be non-localized. The integrated circuit may include an unshielded region, and a first device and a second device proximate to one another wherein at least a portion of the first device and at least a portion of the second device may be located in the unshielded region. At least one of the at least two quantum devices may be a gradiometer-based flux qubit.

The superconducting shield may be sized and positioned to reduce the magnetic field interactions throughout a major portion of the integrated circuit. At least a portion of the first metal layer may act as a superconducting shield in a second shielded region of the integrated circuit so as to limit magnetic field interactions in the second shielded region between at least two devices in the integrated circuit. The first dielectric layer may have a thickness within the range of about 50 nm to about 1000 nm. At least one of the first metal layer and the second metal layer may have a thickness within the range of about 50 nm to about 500 nm.

At least one embodiment may be summarized as an integrated circuit for quantum computing including a first device; a second device; and a metal layer wherein at least a portion of the metal layer forms a superconducting shield in a shielded region of the integrated circuit so as to limit magnetic field interactions in the shielded region between the first device and the second device when the integrated circuit is operated at a temperature suitable for quantum computing.

The integrated circuit may include an unshielded region of the integrated circuit in which at least a portion of the first device and at least a portion of the second device are proximate to one another. The magnetic field interactions between the first device and the second device may exist within the unshielded region. The magnetic field interactions may be produced by a current flowing through at least a portion of at least one of the first device or the second device. At least one of the first device or the second device may not use the superconducting shield as a ground plane. At least one of the first device or the second device may be selected from the group consisting of Josephson junctions, qubits, qubit readouts and qubit-qubit couplers. The first device and the second device may be selected from the group consisting of wiring and conductive traces. The metal layer may include a superconducting material. The superconducting material may be selected from the group consisting of aluminium and niobium. The superconducting shield may localize the magnetic field interactions produced by at least one of the first device or the second device. The superconducting shield may localize the magnetic field interactions produced by the first device and the second device and the first device and the second device are magnetically isolated from each other. A device parameter of the first device may be manipulated without affecting a state of the second device. At least one of the first device or the second device may be a gradiometer-based flux qubit. The superconducting shield may be sized and positioned to reduce the magnetic field interactions throughout a major portion of the integrated circuit. The metal layer may have a thickness within the range of about 50 nm to about 500 nm.

BRIEF DESCRIPTION OF THE SEVERAL VIEWS OF THE DRAWINGS

FIG. 1A is a schematic diagram of a superconducting integrated circuit for quantum computing according to the prior art.

FIG. 1B is a schematic diagram of an embodiment of a superconducting integrated circuit for quantum computing, including a superconducting shield with unshielded portions coupling selected quantum devices according to the present systems, methods and apparatus.

Figure 2A:
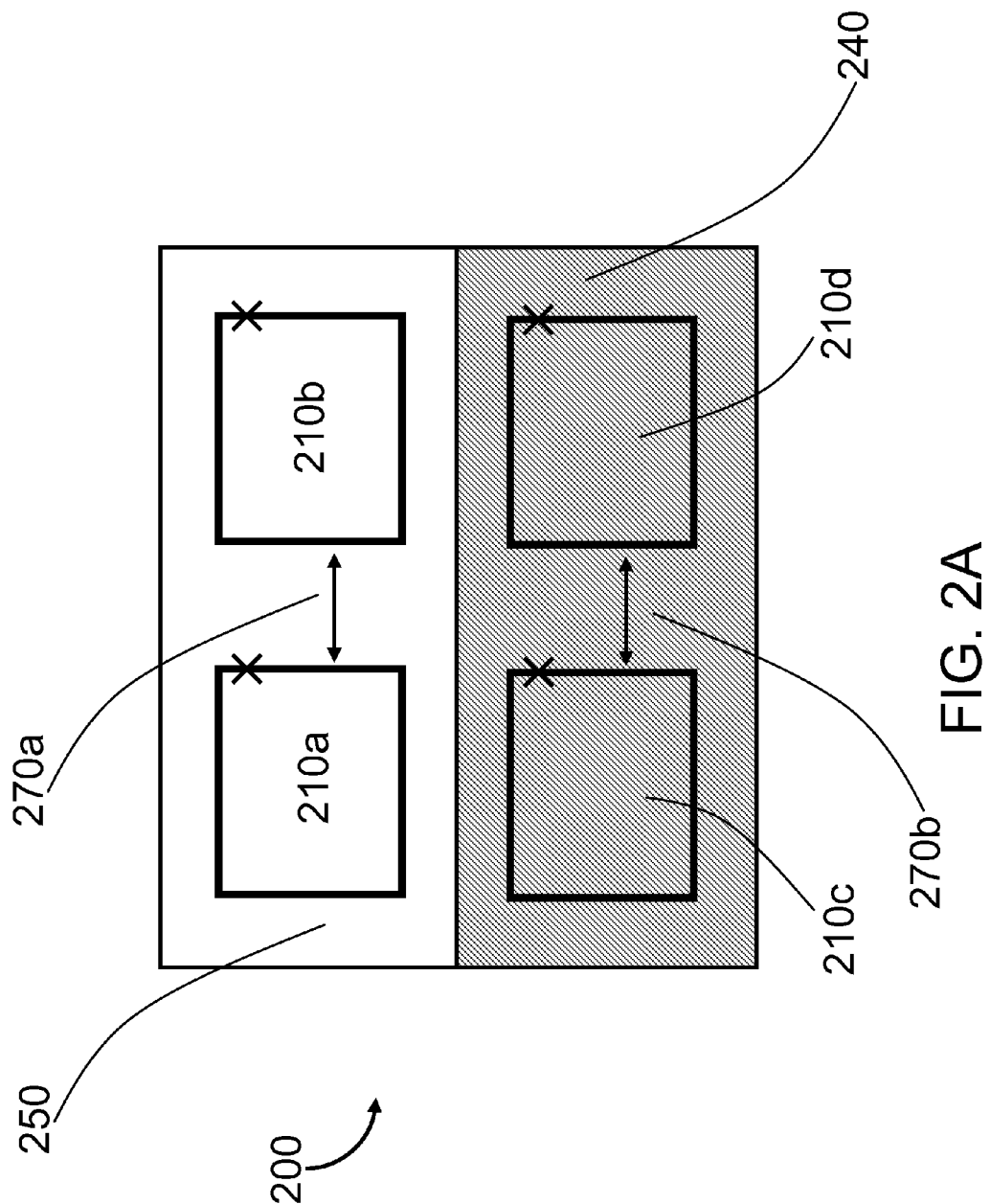
FIG. 2A is a schematic diagram of an embodiment of a superconducting integrated circuit for quantum computing, including superconducting shielded regions and unshielded regions according to the present systems, methods and apparatus.

In the figures, identical reference numbers identify similar elements or acts. The sizes and relative positions of elements in the figures are not necessarily drawn to scale. For example, the shapes of various elements and angles are not drawn to scale, and some of these elements are arbitrarily enlarged and positioned to improve legibility. Further, the particular shapes of the elements as drawn are not intended to convey any information regarding the actual shape of the particular elements and have been solely selected for ease of recognition in the figures. Furthermore, while the figures may show specific layouts, one skilled in the art will appreciate that variations in design, layout, and fabrication are possible and the shown layouts are not to be construed as limiting the geometry of the present systems, methods and apparatus.

DETAILED DESCRIPTION

As the density of devices and wiring populating an integrated circuit containing one or more quantum devices increases, the interference experienced by the quantum devices due to magnetic fields produced by other devices and wiring may become destructive to the quantum effects exhibited by the quantum devices. Therefore, for promotion of quantum effects, it may be desirable to reduce the interference.

The present systems, methods and apparatus may be used to provide areas of shielding in integrated circuits for quantum computing to reduce destructive interference between quantum devices in the integrated circuit and to facilitate desirable interactions between the quantum devices, as well as to shield the quantum devices from destructive interactions due to sources external to the integrated circuit, such as current flowing through external wiring, ferromagnetic metals and proximate integrated circuits.

FIG. 1A illustrates a conventional superconducting integrated circuit 100a. Integrated circuit 100a includes four flux qubits 110a-110d. Qubits 110a-110d are located in close proximity to one another, and since integrated circuit 100a does not include a superconducting shield, the entirety of integrated circuit 100a exists in an "unshielded" region.

The quantum information in qubits 110a-100d is represented by persistent currents circulating in the loop of superconducting material in either a clockwise or counter-clockwise direction, which may be referred to as binary 0 and 1 for example. These flowing currents create magnetic interactions represented by double headed arrows 160a-160f (collectively magnetic fields 160) that correspond to the respective flux qubit state, and correspondingly the flux qubits are sensitive to magnetic fields. Methods for coupling flux qubits include placing them in geographic proximity to one another, thus permitting magnetic fields 160 to interact. However, when multiple qubits are incorporated into an integrated circuit, unwanted interactions may occur as a result of this geographic proximity, such as interaction between magnetic fields 160 produced by qubits 110a-110d, thereby interfering with the quantum effects of the devices and potentially the ability to process information using qubits 110a-110d.

To mitigate interactions between quantum devices in integrated circuits for quantum computing which do not utilize shielding layers, the quantum devices are separated by as large a distance as possible. The scalability of this approach is not acceptable. Chip real estate becomes an important consideration when producing scalable integrated circuits for quantum computing that incorporate many quantum devices. Therefore, magnetic shielding may be used to controllably couple quantum devices together and promote the quantum effects exhibited by quantum devices.

FIG. 1B illustrates a superconducting integrated circuit 100b which has a superconducting shield 140 incorporated into its design according to an embodiment of the present systems, methods and apparatus. Integrated circuit 100b includes four flux qubits 110e-110h in the same configuration as those in integrated circuit 100a. However, in contrast with integrated circuit 100a, because integrated circuit 100b includes superconducting shield 140, magnetic fields 160e-160f (FIG. 1A) produced by qubits 110e-110h are localized to each qubit respectively, and hence magnetic interactions 160e-160f represented by the double headed arrows are omitted from FIG. 1B. Thus, superconducting shielding 140 localizes the fields and protects each qubit 110e-110h from magnetic fields produced by each other qubit 110e-110h, thereby promoting the quantum properties of qubits 110e-110h.

Unshielded regions 150a-150c create controllable couplings between pairs of qubits 110e-110h localized to the devices between which a coupling is desired. For example, as illustrated in FIG. 1B, qubit 110e is only coupled to qubit 110g through qubits 110f and 110h, as illustrated in FIG. 1B by the double headed arrows 160a, 160b, 160c. That is, there is no direct interaction between qubits 110e and 110g, as illustrated by the omission from FIG. 1B of double headed arrow 160d (FIG. 1A). Furthermore, in accordance with the present systems, methods and apparatus, unshielded regions 150a-150c may be used to control the exchange of quantum information between qubits 110e-110h.

FIG. 2A illustrates another embodiment of an integrated circuit 200 according to the present systems, methods and apparatus. Integrated circuit 200 includes four quantum devices 210a-210d and incorporates both a shielded region 240 and an unshielded region 250.

Quantum devices 210a-210d act as sources of magnetic fields, and in the unshielded region 250 the magnetic fields (B) produced by quantum devices 210a-b decrease in magnitude with distance (r) from the device as $$B_{unshielded}(r) \propto \frac{1}{r}.$$

In contrast, in shielded region 240, magnetic fields produced by quantum devices 210c and 210d decrease in magnitude with distance from the device as $$B_{shielded}(r) \propto \frac{1}{r^3}.$$

Thus, shielded region 240 reduces magnetic interference noise from quantum devices 210c and 210d throughout integrated circuit 200. This reduction of magnetic interference noise between quantum devices 210c and 210d may be referred to as magnetic isolation, that is, when current flows in a device (i.e., quantum device 210c), there is approximately zero induced current flow in an adjacent device (i.e., quantum device 210d).

Figure 2B:
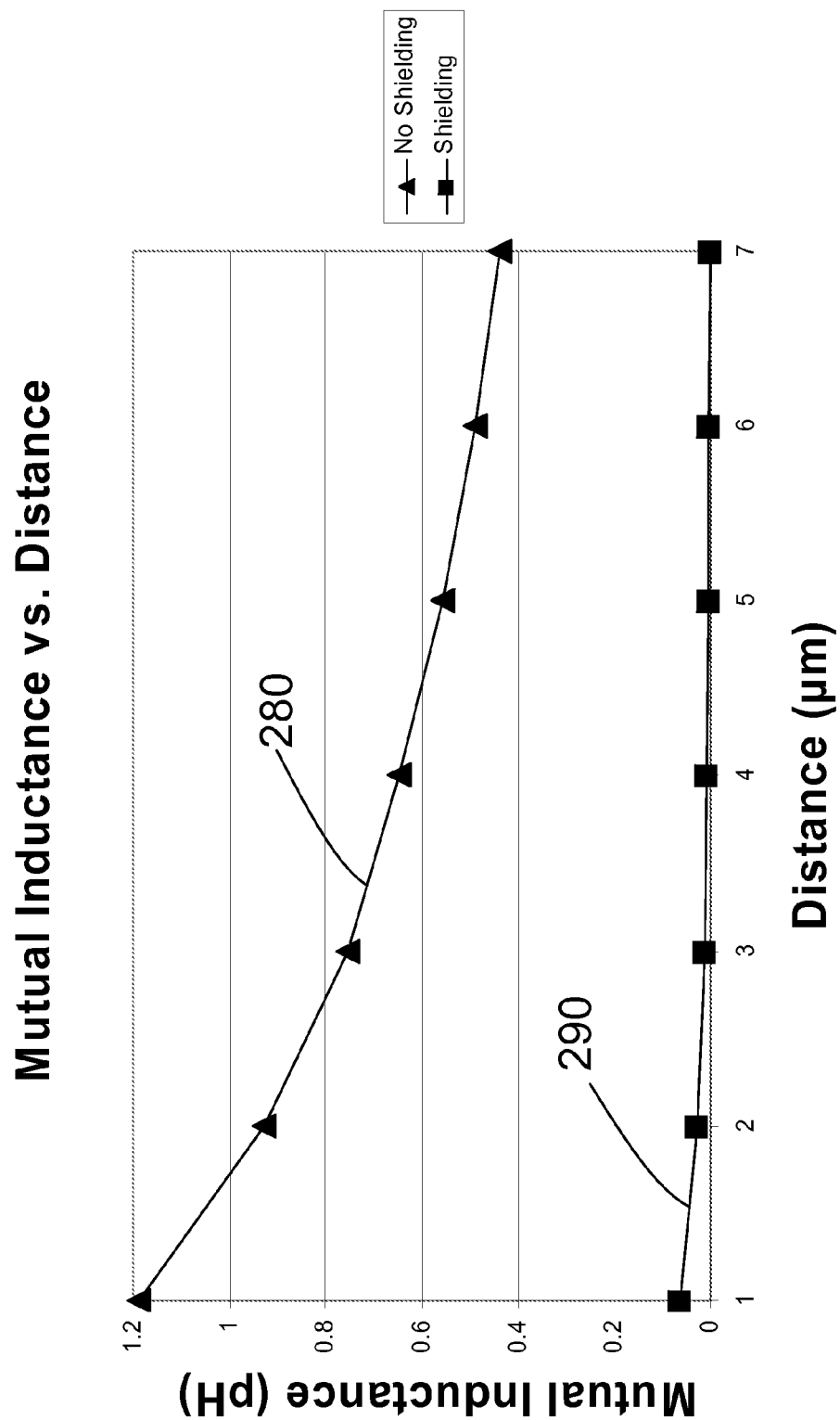
FIG. 2B is a graph of mutual inductance versus distance for two quantum devices in a region with superconducting shielding and a region without superconducting shielding.

FIG. 2B shows the difference in mutual inductance that exists between an exemplary pair of quantum devices in a region with no shielding (i.e., unshielded region 250) and in a region with shielding (i.e., shielded region 240). The graph shows mutual inductance as a function of distance between two devices (i.e., distances 270a and 270b as shown in FIG. 2A). For example, shielded region 240 may be produced by providing a shielding layer on integrated circuit 200 separated from a metal layer containing quantum devices 210c and 210d of integrated circuit 200 by a dielectric layer. Comparing mutual inductance 280 between quantum devices 210a-210b in unshielded region 250 with mutual inductance 290 between quantum devices 210c-210d in shielded region 240: there is an appreciable difference in mutual inductance between quantum devices 210a and 210b in unshielded region 250 and between quantum devices 210c and 210d in shielded region 240 as shown in FIG. 2B.

By separating a metal layer containing quantum devices from a superconducting shielding layer via an insulating region of a thickness, magnetic isolation is achieved between the quantum devices contained in the metal layer separated by a distance 270b. Those of skill in the art will appreciate that the thickness of the shielding layer may vary, depending on the particular implementation, fabrication conditions, operating conditions, etc., and may also vary depending on thin film characteristics, such as stress and quality. Those of skill in the art would appreciate that the thickness of each layer in the integrated circuit may be of about uniform thickness in some embodiments of the present systems, methods and apparatus. Those of skill in the art will appreciate that there is a relationship between the thickness of the insulating region and the distance 270b separating the quantum devices governing the isolation between quantum devices. In some embodiments, a thin insulation thickness may result in fabrication allowances such that quantum devices will be placed proximate, or in close geometrical or spatial proximity, to other quantum devices. In some embodiments, two quantum devices that are spaced apart from one another by a distance that is, for example, approximately 2 times the distance between the top layer and shielding layer are considered to be isolated. In other embodiments, two quantum devices that are spaced apart from one another by a distance that is, for example, approximately 1.5 times the distance between the top layer and shielding layer are considered to be isolated. In further embodiments the thickness of the first metal layer may be the thinnest layer in the integrated circuit and each subsequent layer atop the first metal layer may be of increased thickness. Still further embodiments the thickness of the first metal layer may be the thickest layer in the integrated circuit and each subsequent layer atop the first metal layer may be of decreasing thickness. In further embodiments the thickness of at least one of the dielectric layers incorporated into the integrated circuit may be appreciably thicker than the thickness of the metal layers incorporated into the integrated circuit.

Depending upon the application, in some embodiments of the present systems, methods and apparatus the thickness of at least one of the metal layers incorporated into the integrated circuit may be between 50 and 200 nm and the thickness of at least one of the dielectric layers incorporated into the integrated circuit may be between 50 nm to 1000 nm.

An important difference between RSFQ integrated circuitry and the methods, systems and apparatus disclosed herein is superconducting shielding layers of quantum computing integrated circuits are not utilized as a ground plane by the quantum devices populating the integrated circuit. While the superconducting shielding plane is used to reduce noise within the integrated circuit in a controlled manner, it is not used by the quantum devices of the integrated circuits as a common potential to which voltage signals are compared. While quantum devices may require a common potential to compare voltage signals to, current from the quantum devices would be dumped into the superconducting shielding layer in very close proximity to the quantum devices if the superconducting shielding layer were to be used as a common potential. This dump of current would produce destructive noise in very close proximity to the quantum devices thereby inhibiting the quantum information stored within the quantum devices. For this reason the superconducting shielding is not used as a ground plane within quantum computing integrated circuits.

Figure 3:
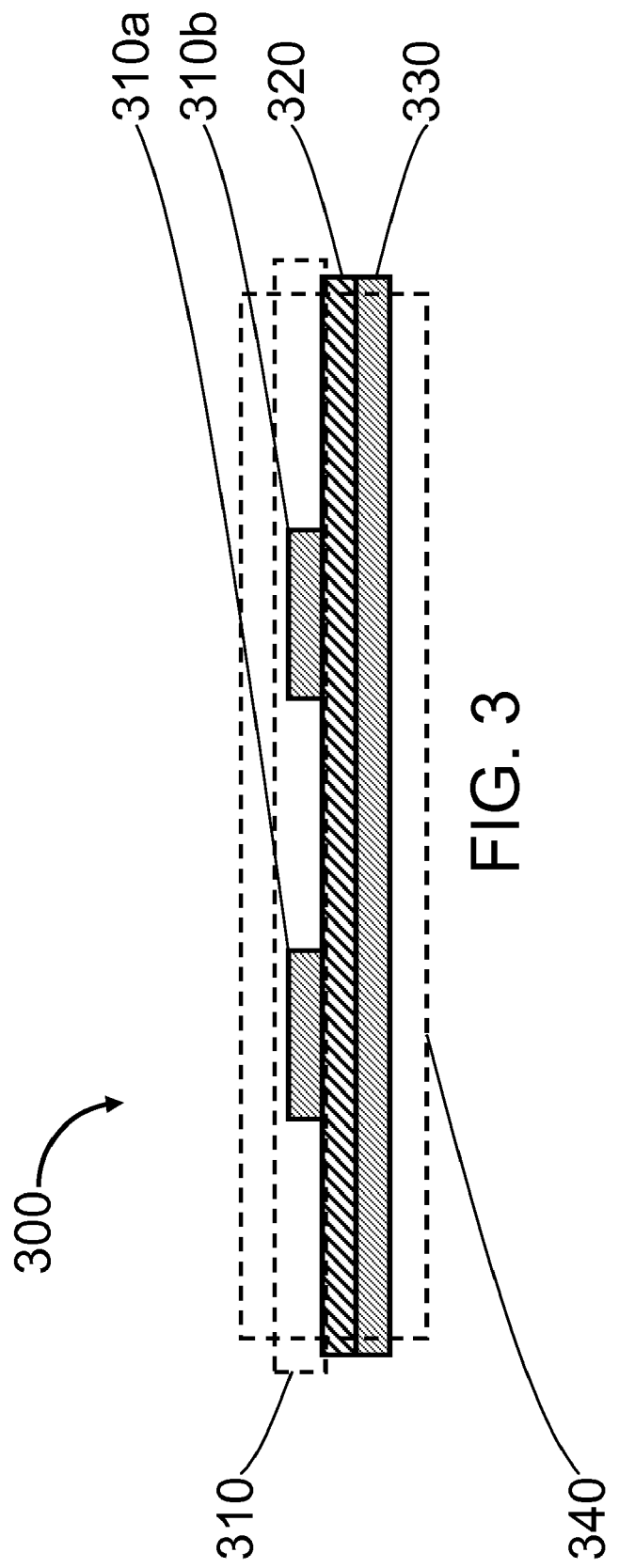
FIG. 3 is a cross-sectional view of another embodiment of a superconducting integrated circuit for quantum computing according to the present systems, methods and apparatus.

FIG. 3 is a cross-sectional view of an integrated circuit 300 for quantum computing according to one embodiment of the present systems, methods and apparatus. Integrated circuit 300 includes a shielded region 340, and quantum devices 310a-310b. Due to the presence of shielded region 340 in integrated circuit 300, quantum devices 310a-310b may be brought into close proximity to one another without negatively impacting their quantum properties.

Shielded region 340 may be created via one or more layers. For example, as illustrated, integrated circuit 300 includes two metal layers 310, 330 and an insulating dielectric layer 320 between metal layers 310, 330.

Devices 310a-310b are located in metal layer 310 and those of skill in the art will appreciate that devices 310a-310b may be any electronic component or device for which magnetic shielding is desired, including, for example, wiring, Josephson junctions, qubits, qubit readouts and qubit-qubit couplers. When current flows through either or both devices 310a-310b, magnetic fields are produced by moving charges. Metal layer 330 acts as a superconducting shielding layer during operation of integrated circuit 300. As metal layer 330 is located in proximity to devices 310a-310b, magnetic field interactions resulting from current flowing in devices 310a-310b are localized. Metal layer 330 acts as a superconducting shielding layer and causes the magnetic fields produced by devices 310a-310b to abide by $B_{shielded}(r)$. Thus, devices 310a and 310b are magnetically isolated from each other, are not coupled to each other, and device parameters, such as the amount of current flowing through a device, of one device may be modified in-situ without affecting the performance of the other device.

To provide the desired shielding, metal layer 330 may include a layer of metal that is capable of superconducting at an operating temperature of integrated circuit 300 (where integrated circuit 300 includes superconducting quantum devices, the operating temperature may be less than about 1 degree Kelvin), such as niobium or aluminium.

Figure 4:
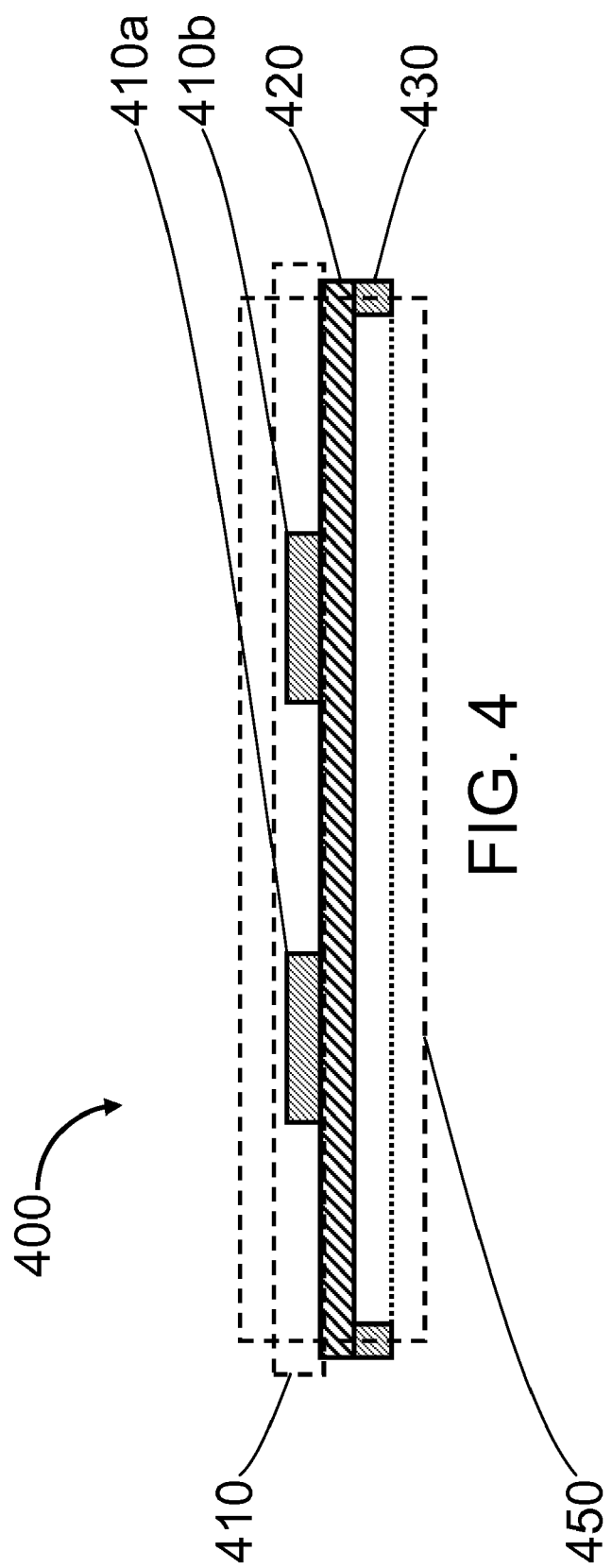
FIG. 4 is a cross-sectional view of another embodiment of a superconducting integrated circuit for quantum computing according to the present systems, methods and apparatus.

FIG. 4 is a cross-sectional view of an integrated circuit 400 for quantum computing according to another embodiment of the present systems, methods and apparatus. Integrated circuit 400 includes an unshielded region 450, two metal layers 410, 430 and an insulating dielectric layer 420 between metal layers 410, 430. Metal layer 430 is not present in unshielded region 450. Devices 410a-b populate metal layer 410 in unshielded region 450 of integrated circuit 400. Devices 410a-410b may be any electronic component or device for which magnetic shielding is desired, including, for example, wiring, Josephson junctions, qubits, qubit readouts and qubit-qubit couplers. Magnetic field interactions between devices 410a-410b are non-localized as the magnetic fields produced by devices 410a-b abide by $B_{unshielded}(r)$. Thus, devices 410a-b are coupled due to the magnetic field interactions which are permitted to occur due to the absence of a superconducting shielding layer, such as metal layer 430.

In some embodiments of the present methods, systems and apparatus, an integrated circuit may include an unshielded region surrounded by a shielded region. In such circuits, magnetic fields produced by devices located in the unshielded region of the circuit will be constrained to the unshielded region as the magnetic fields produced by the devices will abide by $B_{unshielded}(r)$ in the unshielded region and attenuate very quickly once they enter the shielded region.

Figure 5:
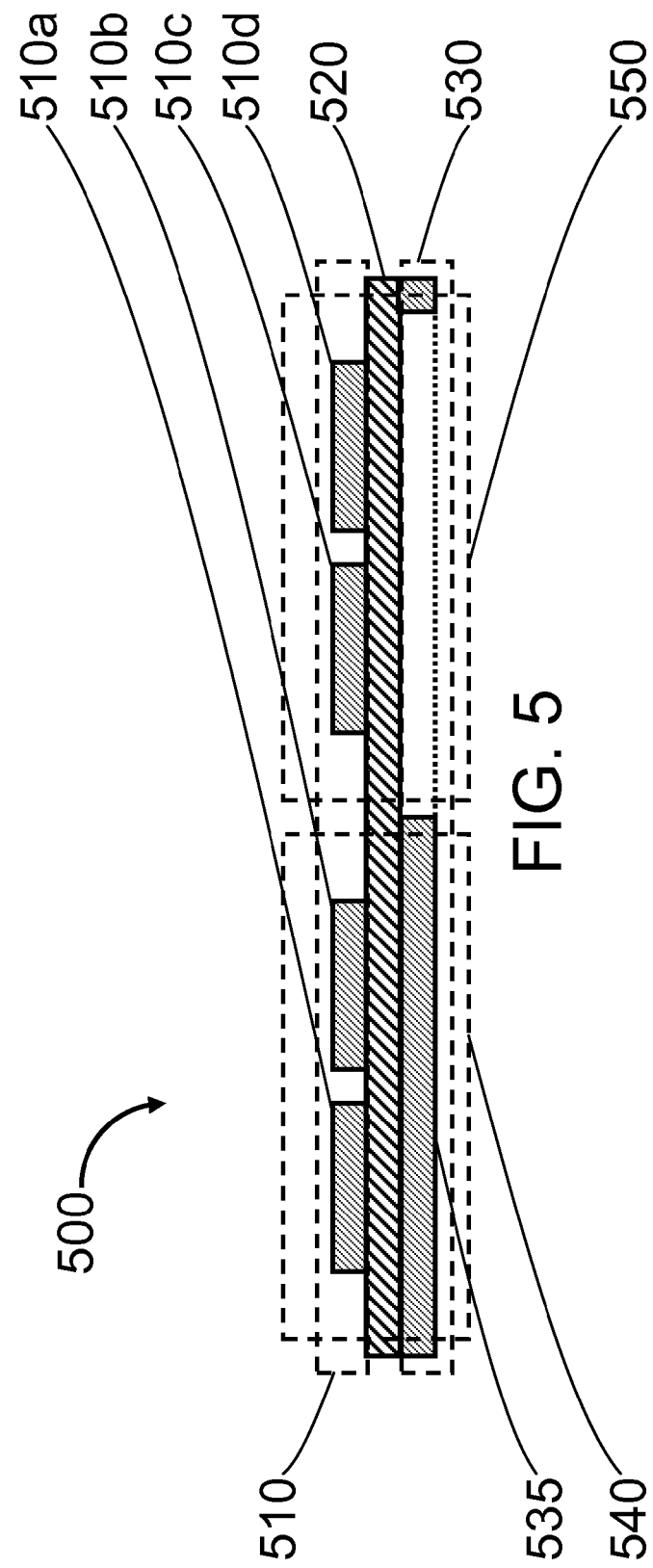
FIG. 5 is a cross-sectional view of another embodiment of a superconducting integrated circuit for quantum computing according to the present systems, methods and apparatus.

FIG. 5 is a cross-sectional view of an integrated circuit 500 for quantum computing according to another embodiment of the present systems, methods and apparatus. Integrated circuit 500 includes a shielded region 540 and an unshielded region 550, two metal layers 510, 530 and an insulating dielectric layer 520 between metal layers 510, 530. Metal layer 530 includes superconducting shielding 535 in shielded region 540 but does not include superconducting shielding in unshielded region 550. To provide superconducting shielding 535, metal layer 530 may include a metal that is capable of superconducting at an operating temperature of integrated circuit 500, such as niobium or aluminium.

Devices 510a-510b populate metal layer 510 in shielded region 540, while devices 510c-510d populate metal layer 510 in unshielded region 550. Devices 510a-510d may be any electronic component or device for which magnetic shielding is desired, including, for example, wiring, Josephson junctions, qubits, qubit readouts and qubit-qubit couplers.

When current flows through either or both devices 510a-510b, magnetic fields are produced by moving charges. However, since devices 510a-510b are located within shielded region 540, magnetic fields resulting from current flowing in devices 510a-51b are localized since superconducting shielding 535 causes the magnetic fields produced by the devices to abide by $B_{shielded}(r)$. Thus, devices 510a-510b are magnetically isolated from each other and are not coupled to each other, such that device parameters of one device may be modified in-situ without affecting the performance of the other device. Furthermore, since the magnetic fields associated with devices 510a-510b are localized, devices 510a-510b are not coupled to devices 510c or 510d.

Devices 510c-510d are located in unshielded region 550. The magnetic fields produced by to these devices are localized to unshielded region 550 and do not significantly penetrate into shielded region 540. Magnetic fields produced by devices located in unshielded region 550 of integrated circuit 500 will be constrained to unshielded region 550 as the magnetic fields produced by the devices will abide by $B_{unshielded}(r)$ in unshielded region 550 and attenuate very quickly once they enter shielded region 540.

Magnetic field interactions between devices 510c-510d are non-localized as magnetic fields produced by devices 510c-510d abide by $B_{unshielded}(r)$. Thus, devices 510c-510d may be coupled due to the field interactions which occur due to the absence of superconducting shielding layer 530 in unshielded region 550.

Figure 6:
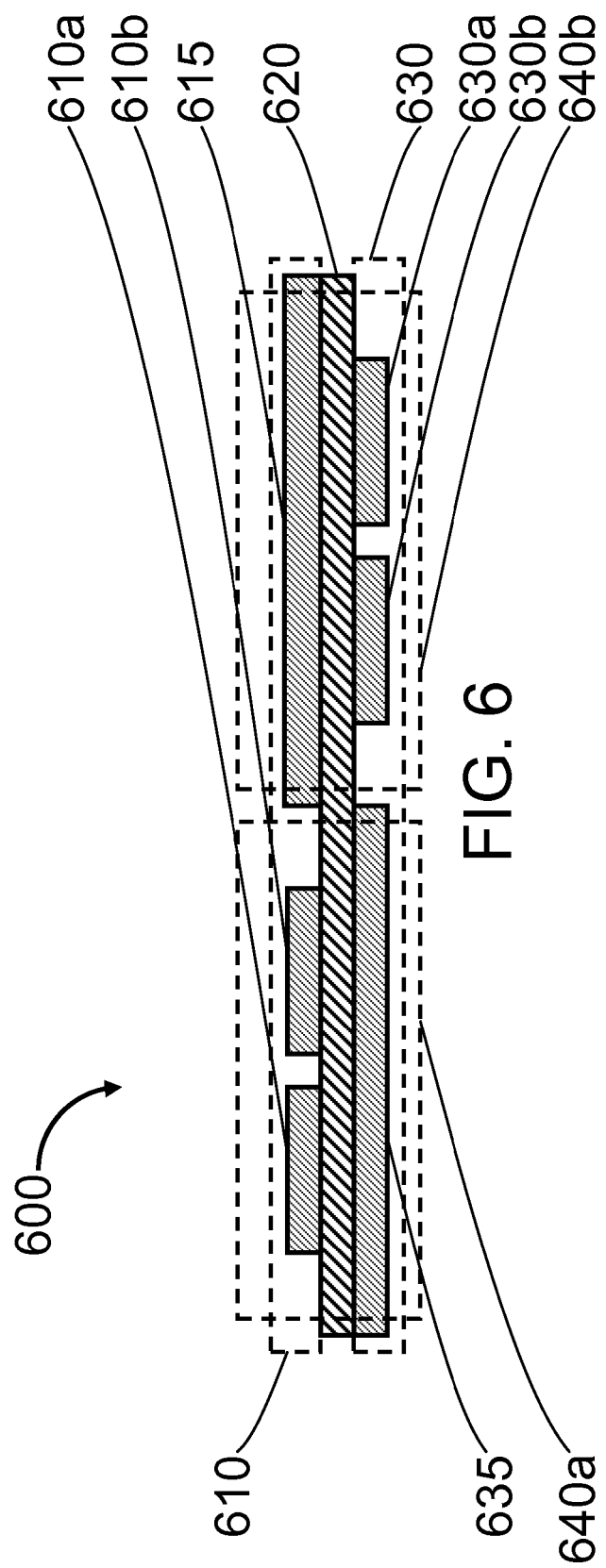
FIG. 6 is a cross-sectional view of another embodiment of a superconducting integrated circuit for quantum computing according to the present systems, methods and apparatus.

FIG. 6 is a cross-sectional view of an integrated circuit 600 for quantum computing according to another embodiment of the present systems, methods and apparatus. Integrated circuit 600 includes two shielded regions 640a, 640b, two metal layers 610, 630 and an insulating dielectric layer 620 between metal layers 610, 630. Metal layer 610 includes superconducting shielding 615 in shielded region 640b while metal layer 630 includes superconducting shielding 635 in shielded region 640a. To provide superconducting shielding 615, 635, metal layers 610, 630 may include a metal that is capable of superconducting at an operating temperature of integrated circuit for quantum computing 600, such as niobium or aluminium.

Devices 610a-b populate metal layer 610 in shielded region 640a, while devices 630a-630b populate metal layer 630 in shielded region 640b. Devices 610a-610b and 630a-630b may be any electronic component or device for which magnetic shielding is desired, including, for example, wiring, Josephson junctions, qubits, qubit readouts and qubit-qubit couplers.

When current flows through either or both devices 610a-610b, magnetic fields are produced by moving charges. Since devices 610a-b are located within shielded region 640a, magnetic field interactions resulting from current flowing in devices 610a-610b are localized since superconducting shielding 635 causes the magnetic fields produced by devices 610a-610b to abide by $B_{shielded}(r)$. Thus, devices 610a-610b are magnetically isolated from each other and are not coupled to each other, so device parameters of one device may be modified without affecting the performance of the other device.

Similarly, when current flows through either or both devices 630a-630b, magnetic fields are produced by moving charges. Since devices 630a-630b are located within shielded region 640b, magnetic field interactions resulting from current flowing in devices 630a-630b are localized since superconducting shielding 615 causes the magnetic fields produced by devices 630a-630b to abide by $B_{shielded}(r)$. Thus, devices 630a-630b are magnetically isolated from each other and are not coupled to each other, so device parameters of one device may be modified without affecting the performance of the other device.

In some embodiments, regions of a first quantum device located within an integrated circuit for quantum computing may be located in a shielded region in order to promote the quantum effects of the integrated circuit while other regions of the quantum device may be located in an unshielded region so as to facilitate the interaction between the first quantum device and a second quantum device. FIG. 1B shows quantum devices 110e-h which are partially in a shielded region 140 and also partially in unshielded regions 150a-150c.

The above description of illustrated embodiments is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other quantum computing systems, methods and apparatus, not necessarily the exemplary quantum computing systems, methods and apparatus generally described above.

As will be apparent to those skilled in the art, the various embodiments described above can be combined to provide further embodiments. Aspects of the present systems, methods and apparatus can be modified, if necessary, to employ systems, methods, apparatus and concepts of the various patents, applications and publications to provide yet further embodiments of the invention. For example, the various systems, methods and apparatus may include a different number of metal or dielectric layers than set out in the illustrated embodiments, such as three or more metal layers and two or more insulating dielectric layers alternating with the metal layers, the layers may be disposed in a different order or area, or the embodiments may omit some elements, and/or employ additional elements.

All of the U.S. patents, U.S. patent application publications, U.S. patent applications, referred to in this specification are incorporated herein by reference, in their entirety and for all purposes. Aspects of the embodiments can be modified, if necessary, to employ systems, circuits and concepts of the various patents, applications and publications to provide yet further embodiments.

These and other changes can be made to the present systems, methods and apparatus in light of the above description. In general, in the following claims, the terms used should not be construed to limit the invention to the specific embodiments disclosed in the specification and the claims, but should be construed to include all possible embodiments along with the full scope of equivalents to which such claims are entitled. Accordingly, the invention is not limited by the disclosure, but instead its scope is to be determined entirely by the following claims.

We claim:

1. A superconducting integrated circuit comprising:
   a superconducting qubit;
   a superconducting device; and
   a superconducting plane that underlies at least a first portion of the superconducting qubit and at least a first portion of the superconducting device, wherein the first portion of the superconducting qubit and the first portion of the superconducting device are magnetically isolated from one another, and wherein the superconducting plane does not underlie at least a second portion of the superconducting qubit and at least a second portion of the superconducting device, wherein the second portion of the superconducting qubit and the second portion of the superconducting device are not magnetically isolated from one another.

2. The superconducting integrated circuit of claim 1 wherein the second portion of the superconducting qubit and the second portion of the superconducting device are positioned to magnetically couple to one another when a current passes through at least one of the second portion of the superconducting qubit or the second portion of the superconducting device.

3. The superconducting integrated circuit of claim 1 wherein the superconducting qubit and the superconducting device do not use the superconducting plane as a ground plane.

4. The superconducting integrated circuit of claim 1 wherein the superconducting qubit is a superconducting flux qubit.

5. The superconducting integrated circuit of claim 1, further comprising:
   a dielectric layer having a first surface and a second surface, wherein the superconducting plane is carried on the first surface and both the superconducting qubit and the superconducting device are carried on the second surface.

6. The superconducting integrated circuit of claim 1 wherein the superconducting device is selected from the group consisting of: a superconducting qubit, a superconducting coupling device, a superconducting quantum interference device, a superconducting wire, a superconducting flux bias line, and a single flux quantum device.

7. A superconducting integrated circuit comprising:
   a superconducting qubit;
   a superconducting device; and
   a superconducting plane that underlies at least a first portion of the superconducting qubit and at least a first portion of the superconducting device,
   wherein a magnetic field produced by a current passing through the first portion of the superconducting qubit is attenuated in proportion to $1/r^n$, where r is a distance from the first portion of the superconducting qubit and n is greater than 1, and wherein the superconducting plane does not underlie at least a second portion of the superconducting qubit and at least a second portion of the superconducting device, wherein a magnetic field produced by a current passing through the second portion of the superconducting qubit is attenuated in proportion to $1/r$.

8. The superconducting integrated circuit of claim 7 wherein n is at least approximately equal to 3.

9. The superconducting integrated circuit of claim 7 wherein the second portion of the superconducting qubit and the second portion of the superconducting device are positioned to magnetically couple to one another when a current passes through the second portion of the superconducting qubit.

10. The superconducting integrated circuit of claim 7 wherein the superconducting qubit and the superconducting device do not use the superconducting plane as a ground plane.

11. The superconducting integrated circuit of claim 7 wherein the superconducting qubit is a superconducting flux qubit.

12. The superconducting integrated circuit of claim 7, further comprising:
    a dielectric layer having a first surface and a second surface, wherein the superconducting plane is carried on the first surface and both the superconducting qubit and the superconducting device are carried on the second surface.

13. The superconducting integrated circuit of claim 7 wherein the superconducting device is selected from the group consisting of: a superconducting qubit, a superconducting coupling device, a superconducting quantum interference device, a superconducting wire, a superconducting flux bias line, and a single flux quantum device.

14. A superconducting integrated circuit comprising:
    a superconducting qubit;
    a superconducting device; and
    a superconducting plane that underlies at least a first portion of the superconducting qubit and at least a first portion of the superconducting device, wherein a magnetic field produced by a current passing through the first portion of the superconducting device is attenuated in proportion to $1/r^n$, where r is a distance from the first portion of the superconducting device and n is greater than 1, and wherein the superconducting plane does not underlie at least a second portion of the superconducting qubit and at least a second portion of the superconducting device, wherein a magnetic field produced by a current passing through the second portion of the superconducting device is attenuated in proportion to $1/r$.

15. The superconducting integrated circuit of claim 14 wherein n is at least approximately equal to 3.

16. The superconducting integrated circuit of claim 14 wherein the second portion of the superconducting qubit and the second portion of the superconducting device are positioned to magnetically couple to one another when a current passes through the second portion of the superconducting device.

17. The superconducting integrated circuit of claim 14 wherein the superconducting qubit and the superconducting device do not use the superconducting plane as a ground plane.

18. The superconducting integrated circuit of claim 14 wherein the superconducting qubit is a superconducting flux qubit.

19. The superconducting integrated circuit of claim 14, further comprising:
   a dielectric layer having a first surface and a second surface, wherein the superconducting plane is carried on the first surface and both the superconducting qubit and the superconducting device are carried on the second surface.

20. The superconducting integrated circuit of claim 14 wherein the superconducting device is selected from the group consisting of: a superconducting qubit, a superconducting coupling device, a superconducting quantum interference device, a superconducting wire, a superconducting flux bias line, and a single flux quantum device.

* * * * *